Figure 1:
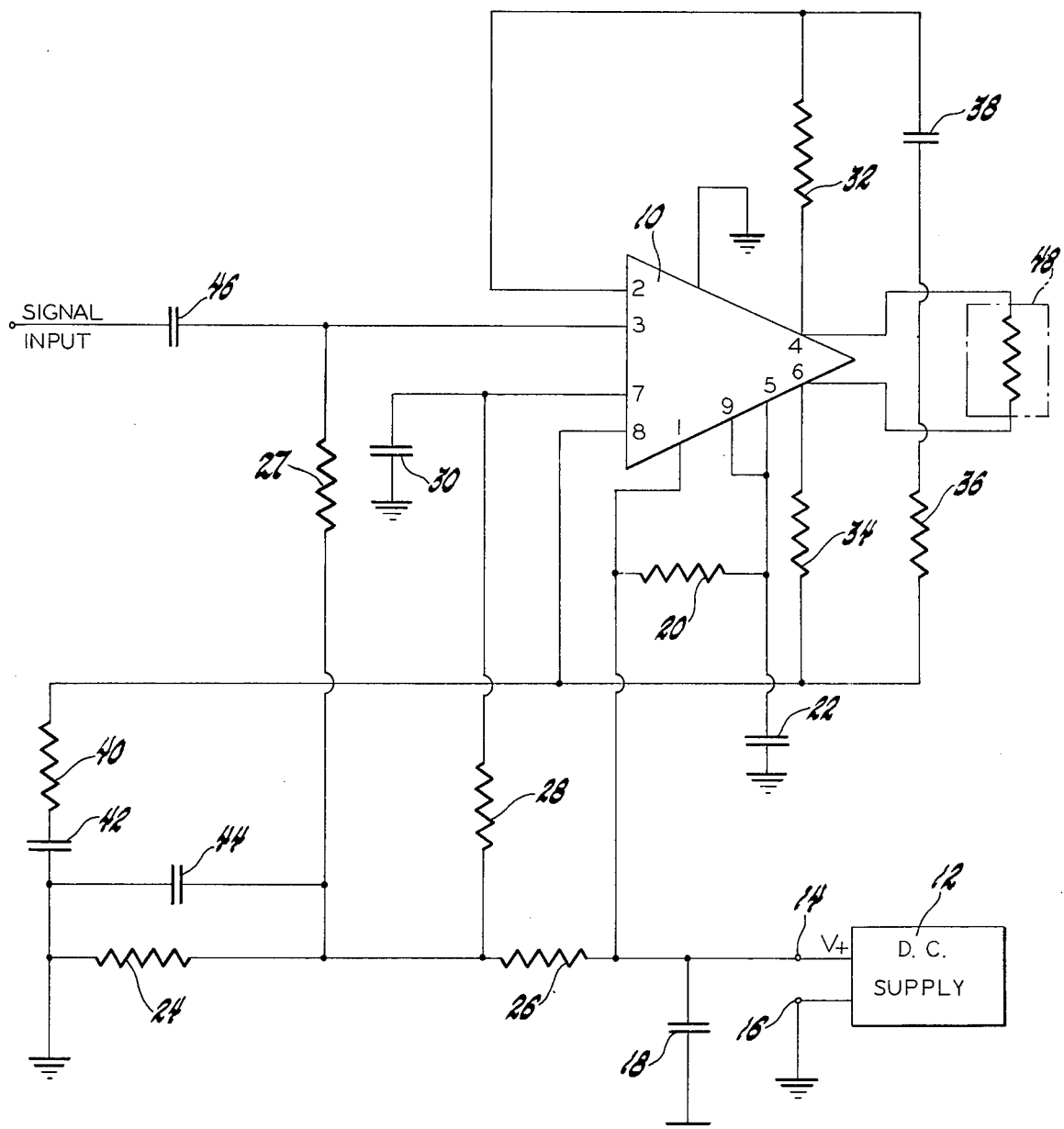

United States Patent [19]

Schertz et al.

[11] 4,053,996
[45] Oct. 18, 1977

[54] POWER AMPLIFIER PROTECTION CIRCUIT

[75] Inventors: Burtron D. Schertz, Kokomo; Fredrick A. Aldridge, Russiaville, both of Ind.

[73] Assignee: General Motors Corporation, Detroit, Mich.

[21] Appl. No.: 669,899

[22] Filed: Mar. 24, 1976

[51] Int. Cl.² .............................................. H02H 7/20
[52] U.S. Cl. .................................. 361/98; 330/207 P; 361/103; 361/91
[58] Field of Search ................. 317/31, 33 R, 33 VR, 317/33 SC; 330/207 P; 307/202 R

[56] References Cited

U.S. PATENT DOCUMENTS

| | | | |
|---|---|---|---|
| 3,449,680 | 6/1969 | Schilb et al. | 330/207 P |
| 3,496,449 | 2/1970 | O'Connor | 323/9 |
| 3,564,338 | 2/1971 | Teshirogi et al. | 317/33 R X |
| 3,755,751 | 8/1973 | Ring | 330/207 P X |
| 3,814,988 | 6/1974 | Ito | 317/31 R |
| 3,898,532 | 8/1975 | Frank | 330/207 P X |
| 3,924,159 | 12/1975 | Hoover | 317/33 R |
| 3,988,644 | 10/1976 | Krone | 330/207 P X |

Primary Examiner—J D Miller
Assistant Examiner—Patrick R. Salce
Attorney, Agent, or Firm—Howard N. Conkey

[57] ABSTRACT

A protection circuit for a bridge audio power amplifier having two pairs of output transistors coupled between positive and negative terminals of a direct current supply and providing a pair of output terminals for connection across a load. The bias of the output transistors are controlled in response to excessive current flow, a short of the output terminals to ground, excessive DC supply voltage, a short of the output terminals to the positive terminal of the DC supply, and excessive temperature to prevent permanent damage to the bridge audio power amplifier.

4 Claims, 2 Drawing Figures

POWER AMPLIFIER PROTECTION CIRCUIT

This invention is directed to a protection circuit for a power amplifier.

It is well known that transistors are susceptible to permanent damage when they are subjected to excessive power dissipation and high temperatures. In systems such as audio power amplifier systems, it is desirable to prevent operation in fault modes which could result in permanent damage thereto so that upon correction of the fault, the amplifier may resume proper operation. This is particularly applicable to integrated circuits where a damaged component cannot be replaced without replacing the complete circuit. It is the general object of this invention to provide an improved protection circuit for a power amplifier.

It is another object of this invention to provide an improved protection circuit for a bridge audio power amplifier having output transistors biased non-conductive upon detection of system faults.

It is another object of this invention to provide a protection circuit for a bridge power amplifier having output power transistors biased non-conductive upon detection of system operation into a short to the positive terminal of the amplifier power supply.

It is another object of this invention to provide for a protection circuit for a bridge power amplifier having output power transistors which are biased non-conductive in response to a short to ground reference potential through an impedance.

Figure 2:
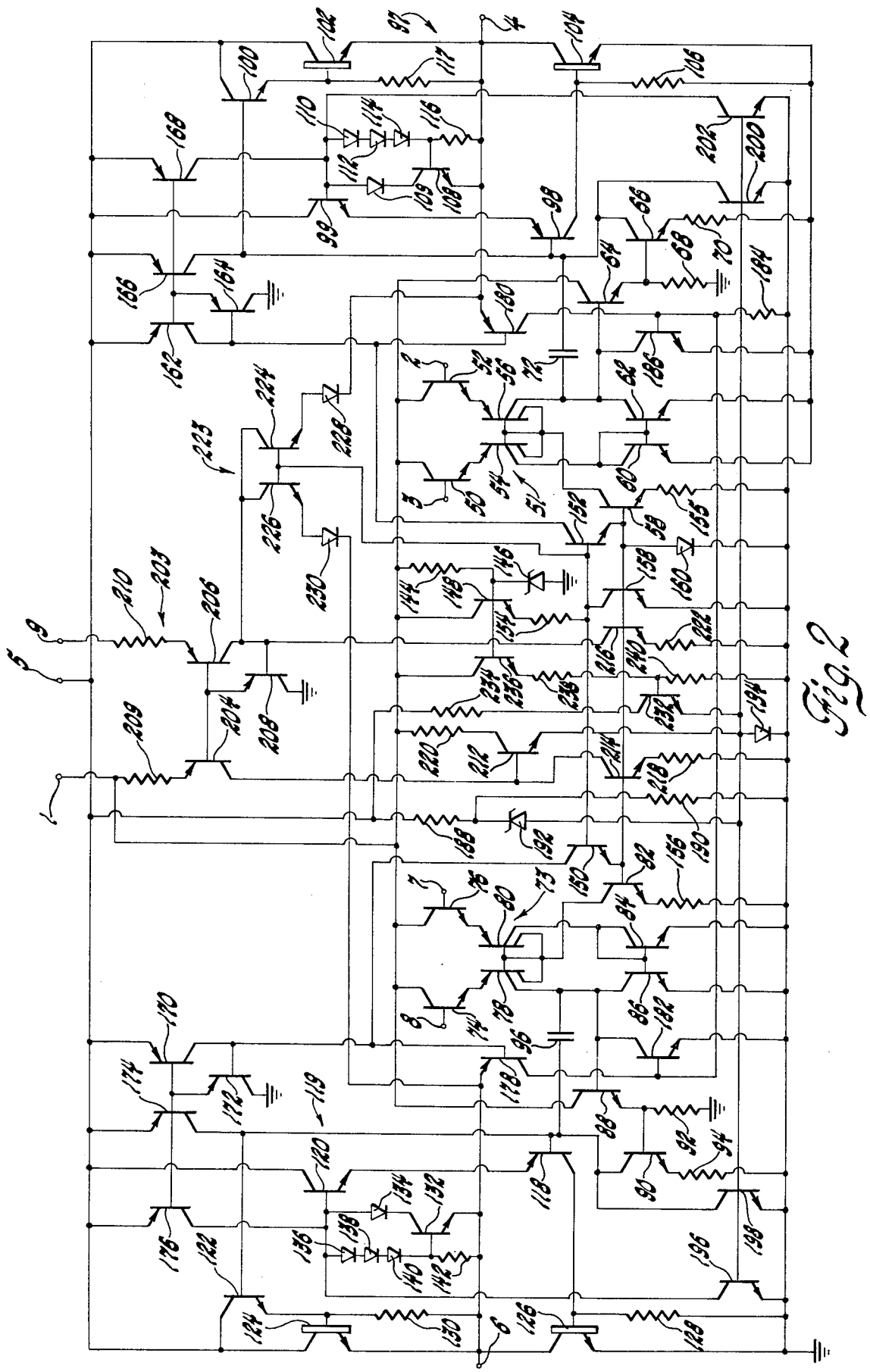

These and other objects of this invention may be best understood by reference to the following description of a preferred embodiment and the drawings in which:

FIG. 1 is a schematic drawing of a bridge audio power amplifier system incorporating the principles of the invention and, FIG. 2 is a circuit drawing of the bridge audio power amplifier and protection circuit of FIG. 1.

Referring to FIG. 1, there is illustrated a bridge audio power amplifier 10 in the form of an integrated circuit having output terminals 4 and 6 and supply voltage terminals 1, 5 and 9. The bridge audio power amplifier 10 also has a non-inverting input terminal 3 and an inverting terminal 2 for controlling the voltage level at the output terminal 4 and has a non-inverting input terminal 7 and an inverting input terminal 8 for controlling the voltage level at the output terminal 6.

A DC supply 12 provides a DC voltage V+ across a positive output terminal 14 and a grounded negative output terminal 16. A filtering capacitor 18 is coupled between the positive and negative output terminals 14 and 16 to provide filtering of the DC voltage V+.

The positive output terminal 14 is directly coupled to the supply voltage terminal 1 of the bridge audio power amplifier 10 and to the supply voltage terminals 5 and 9 thereof through a current sensing resistor 20 which detects IR drops in the millivolt range. For example, the resistance of resistor 20 may be of a value such that 4 amperes therethrough results in a voltage drop of 100 millivolts. The supply voltage terminals 5 and 9 are coupled to ground through a filtering capacitor 22.

A voltage divider comprised of series coupled resistors 24 and 26 having equal resistance values is coupled between the positive and negative output terminals 14 and 16 of the DC supply 12 to provide a voltage equal to one-half of the DC voltage V+ at their junction. This voltage is coupled to the non-inverting input terminal 3 through a resistor 27 and coupled to the non-inverting input 7 through a resistor 28. The non-inverting input terminal 7 is coupled to ground through a filtering capacitor 30. A feedback gain setting resistor 32 is coupled between the output terminal 4 and the inverting input terminal 2 and a gain setting feedback resistor 34 is coupled between the output terminal 6 and the inverting input terminal 8. A gain setting resistor 36 and a gain setting capacitor 38 are series coupled between the inverting input terminals 2 and 8. A delay network comprised of a series coupled resistor 40 and a capacitor 42 is coupled between the inverting input terminal 8 and ground. A filtering capacitor 44 is coupled across the resistor 24 of the voltage divider.

The input audio signal to be amplified is coupled to the non-inverting input terminal 3 of the bridge audio power amplifier 10 through a coupling capacitor 46. The output of the bridge audio power amplifier 10 across the output terminals 4 and 6 is coupled across a load 48 which may be, for example, an audio speaker.

With no signal input to the non-inverting input terminal 3 of the bridge audio power amplifier 10, the output potential at each of the output terminals 4 and 6 is equal to one-half of the DC voltage V+ from the DC supply 12. Consequently, there is no potential across the load 48. For positive voltage excursions (increasing from V+/2) at the output terminal 4 resulting from positive input signals to the non-inverting input terminal 3, equal but opposite voltage excursions (decreasing from V+/2) is provided at the output terminal 6 resulting from feedback through the feedback elements 32, 34, 36 and 38 to provide an amplified voltage signal across the load 48. Conversely, for negative excusions of the output voltage at the output terminal 4 resulting from negative input signals to the non-inverting input terminal 3, equal but opposite voltage excursions are generated at the output terminal 6 to provide the amplified signal across the load 48. In this manner, amplified audio signals having voltage excusions approaching twice the magnitude V+ may be supplied to the load 48.

Referring to FIG. 2 there is illustrated a schematic diagram of the bridge audio power amplifier 10 of FIG. 1. The bridge audio power amplifier 10 is basically comprised of a pair of differential voltage amplifiers, a pair of output stages, bias circuitry and the protection circuit of this invention.

The audio signal input supplied to the input terminal 3 of the bridge audio power amplifier 10 is coupled to the base of an NPN transistor 50 of a differential voltage amplifier 51. The feedback signal applied to the inverting input terminal 2 of the bridge audio power amplifier 10 is coupled to the base of an NPN transistor 52 in the differential voltage amplifier 51. The collectors of the transistors 50 and 52 are coupled to the voltage supply terminal 1.

The differential voltage amplifier 51 also includes a pair of PNP transistors 54 and 56 having their emitters coupled to the emitters of the transistors 50 and 52, respectively. The base and one collector of each of the transistors 54 and 56 are coupled to the collector of an NPN transistor 58 which provides DC bias for the differential amplifier 51 as will be described. A second collector of the transistor 54 is coupled to both the collector and base of an NPN transistor 60 of a current mirror whose emitter is grounded. A second collector of the transistor 56 is coupled to the collector of an NPN transistor 62 of the current mirror. The base of the transistor 62 is coupled to the base of the transistor 60 and the emitter thereof is grounded.

A differential to single ended converter is provided which is comprised of a common emitter stage including an NPN transistor 64 and an NPN amplifier transistor 66. The collector of the transistor 62 is coupled to the base of the NPN transistor 64 whose emitter is coupled to the base of the NPN amplifier transistor 66 and to ground through a resistor 68. The collector of the transistor 64 is coupled to the voltage supply terminal 1. The emitter of the amplifier transistor 66 is coupled to ground through a resistor 70. A capacitor 72 is coupled between the collector of the transistor 62 and the collector of the transistor 66. The voltage at the collector of the transistor 66 comprises the output of the differential to single ended converter.

A second differential amplifier 73 includes an NPN transistor 74 whose base is coupled to the inverting input terminal 8 and an NPN transistor 76 whose base is coupled to the non-inverting input terminal 7. The collectors of the transistors 74 and 76 are coupled to the voltage supply terminal 1.

The differential voltage amplifier 73 also includes a pair of PNP transistors 78 and 80 having their emitters coupled to the emitters of the transistors 74 and 76, respectively. The base and one collector of each of the transistors 78 and 80 are coupled to the collector of an NPN transistor 82 which provides DC bias for the differential amplifier 73 as will be described. A second collector of the transistor 80 is coupled to both the base and collector of an NPN transistor 84 of a current mirror whose emitter is grounded. A second collector of the transistor 78 is coupled to the collector of an NPN transistor 86 of the current mirror. The base of the transistor 86 is coupled to the base of the transistor 84 and the emitter thereof is grounded.

A second differential to single ended converter is provided which is comprised of a common emitter stage including an NPN transistor 88 and an NPN amplifier transistor 90. The collector of the transistor 86 is coupled to the base of the NPN transistor 88 whose emitter is coupled to the base of the NPN amplifier transistor 90 and to ground through a resistor 92. The collector of the transistor 88 is coupled to the voltage supply terminal 1. The emitter of the transistor 90 is coupled to ground through a resistor 94. A capacitor 96 is coupled between the collector of the transistor 86 and the collector of the transistor 90. The voltage at the collector of the transistor 90 comprises the output of the differential to single ended converter.

The output of the differential to single ended converter at the collector of the transistor 66 is applied to an output stage 97 including a PNP transistor 98, an NPN transistor 99, an NPN transistor 100, and a pair of NPN power output transistors 102 and 104. The output transistors 102 and 104 are series coupled between the supply voltage terminal 5 and ground and provide an output to the output terminal 4 between the collector of the transistor 104 and the emitter of the transistor 102.

The collector of the transistor 66 is coupled to the base of the transistor 98 and the base of the transistor 100. The emitter of the transistor 98 is coupled to the emitter of the transistor 99 whose collector is coupled to the supply voltage terminal 5. The collector of the transistor 98 is coupled to the base of the transistor 104 and to ground through a resistor 106. The base of the transistor 99 is coupled to the collector of a transistor 108 through a diode 109. The base of the transistor 99 is also coupled to the base of the transistor 108 through a diode stack comprised of diodes 110, 112 and 114. The base of the transistor 108 is coupled to its emitter and to the output terminal 4 through a resistor 116. The collector of the transistor 100 is coupled to the collector of the output transistor 102 and its emitter is coupled to the base of the transistor 102. A resistor 117 is coupled between the base of the transistor and the output terminal 4.

The output of the differential to single ended converter at the collector of the transistor 90 is applied to an output stage 119 which includes a PNP transistor 118, an NPN transistor 120, an NPN transistor 122 and a pair of NPN power output transistors 124 and 126. The power output transistors 124 and 126 are serially connected between the supply voltage terminal 5 and ground and provide an output to the output terminal 6 at the collector of the transistor 126 and the emitter of the transistor 124.

The collector of the transistor 90 is coupled to the base of the transistor 118 and to the base of the transistor 122. The collector of the transistor 118 is coupled to the base of the transistor 126 and to ground through a resistor 128. The emitter of the transistor 118 is coupled to the emitter of the transistor 120 whose collector is coupled to the supply voltage terminal 5. The collector of the transistor 122 is coupled to the collector of the transistor 124 and the emitter thereof is coupled to the base of the transistor 124 and to the output terminal 6 through a resistor 130. The base of the transistor 120 is coupled to the collector of an NPN transistor 132 through a diode 134. The emitter of the transistor 132 is coupled to the output terminal 6. The base of the transistor 120 is also coupled to the base of the transistor 132 through a diode stack comprised of diodes 136, 138 and 140. The base of the transistor 132 is coupled to the output terminal 6 through a resistor 142.

Three pairs of DC bias currents are required to set up the differential voltage amplifiers 51 and 73 and the output stages 97 and 119. A first pair of currents is provided for operating the diode stacks in the output stages 97 and 119, a second pair of currents is provided to the amplifier transistors 66 and 90, and a third pair of currents is provided for setting the transconductance of the differential voltage amplifiers 51 and 73. These currents find their origin in a regulated voltage generated by means of a resistor 144 series coupled with Zener diode 146 between ground and the positive output terminal 14 of the DC supply 12 of FIG. 1.

The constant voltage across the Zener diode 146 is coupled to the base of an emitter follower NPN transistor 148 whose collector is coupled to the supply voltage terminal 1 and whose emitter is coupled to the base of each of a pair of NPN transistors 150 and 152 through a resistor 154. The emitter of the transistor 150 and the emitter of the transistor 152 are both coupled to the base of each of the transistors 58 and 82. The emitter of the transistor 58 is coupled to ground through a resistor 155 and the emitter of the transistor 82 is coupled to ground through a resistor 156. An NPN transistor 158 has its collector coupled to the base of each of the transistors 150 and 152, its emitter coupled to ground and its base coupled to the emitters of each of the transistors 150 and 152. A diode 160 is coupled between the emitter of each of the transistors 150 and 152 and ground. The area of the diode 160 is made equal to twice the emitter area of the transistor 158.

The collector of the transistor 152 is coupled to the collector of a PNP transistor 162 and the base of a PNP transistor 164. The emitter of the transistor 162 is coupled to the supply voltage terminal 5 and the collector of the transistor 164 is coupled to a grounded substrate. The emitter of the transistor 164 is coupled to the base of the transistor 162 and to the base of each of a pair of PNP transistors 166 and 168. The emitters of the transistors 166 and 168 are coupled to the supply voltage terminal 5. The collector of the transistor 168 is coupled to the base of the transistor 99 and the diode stack comprised of the diodes 110, 112, and 114. The collector of the transistor 166 is coupled to the base of the transistor 100 and to the base of the transistor 98.

The collector of the transistor 150 is coupled to the collector of a PNP transistor 170 and to the base of a PNP transistor 172. The emitter of the transistor 170 is coupled to the supply voltage terminal 5 and the collector of the transistor 172 is coupled to a grounded substrate. The emitter of the transistor 172 is coupled to the base of the transistor 170 and to the base of each of a pair of PNP transistors 174 and 176. The emitter of each of the transistors 174 and 176 is coupled to the supply voltage terminal 5. The collector of the transistor 176 is coupled to the base of the transistor 120 and to the diode stack comprised of the diodes 136, 138 and 140. The collector of the transistor 174 is coupled to the base of the transistor 122.

The voltage across the Zener diode 146 is translated to the resistor 154 through the emitter follower transistor 148. The current through the resistor 154, which is the set-up current, biases the transistors 150 and 152 conductive which in turn causes the transistors 158, 58 and 82 and the diode 160 to conduct. Since the area of the diode 160 is twice the area of transistor 158 and the transistor 158 is conducting essentially the set-up current through the resistor 154, the diode 160 is conducting twice the set-up current. This current through the diode 160 is divided equally between the transistors 150 and 152 which supply respective set-up currents to each side of the bridge audio power amplifier. The set-up current through the transistor 152 biases the transistors 162, 164, 166 and 168 conductive. The transistor 166 supplies current to the amplifier transistor 66 and the transistor 168 supplies the current for operating the diode stack comprised of the diodes 110, 112 and 114. The set-up current through the transistor 150 biases the transistors 170, 172, 174 and 176 conductive. The transistor 174 supplies current to the amplifier transistor 90 and the transistor 176 supplies the current for operating the diode stack comprised of the diodes 136, 138 and 140. Conduction of the transistors 58 and 62 provide the currents to set the transconductance of the differential voltage amplifiers 51 and 73.

In response to audio signals supplied to the non-inverting input terminal 3, a voltage is provided at the collector of the transistor 66 for controlling the conduction of the transistors 98 and 100 which in turn control the transistors 102 and 104. For example, an increasing voltage at the non-inverting terminal 3 results in an increase in voltage at the collector of the transistor 66. This increase in voltage effects control of the transistor 102 and transistor 104 to raise the voltage at the output terminal 4 by an amount determined by the magnitude of the input signal to the non-inverting input terminal 3. The increase in the outpt at the output terminal 4 results in a positive signal coupled to the inverting input terminal 8 of the differential amplifier 73. This signal effects control of the transistor 126 and the transistor 124 to lower the voltage at the output terminal 6. The voltage differential between the output terminals 4 and 6 comprises the amplified audio signal which is applied across the speaker load 48.

If the output transistors 102, 104, 124 and 126 were allowed to conduct excessive current or if their temperatures were allowed to exceed a predetermined value, they would be permanently damaged as a result thereof. Excessive current conduction by the output power transistors 102, 104, 124 and 126 resulting in their damage could result from operation in a number of failure modes. These failure modes include excessive supply voltage, a short to ground at a location between the output terminals 4 and 6, or a short to the positive terminal 14 of the DC supply 12 at a location between the output terminals 4 and 6. The protection circuit of this invention provides for controlling the bias of the output power transistors 102, 104, 124 and 126 when these failure modes and sensed excessive temperatures are detected to prevent permanent damage to the amplifier system.

SHORT TO PLUS PROTECTION

If either of the output terminals 4 and 6 were shorted to the positive terminal 14 of the DC supply 12, current through the respective power transistor 104 or 126 is increased, as there is no current limit, and over dissipation could occur. To provide protection in the event of such a short, a PNP transistor 178 is provided which functions as a form of voltage comparator or detector which effects the biasing of the output transistors 104 and 126 non-conductive in the event the voltage at the output terminal 6 increases to a predetermined voltage level greater than the maximum voltage level occurring during normal operation of the bridge audio power amplifier and which represents a short to the positive terminal 14. A corresponding PNP transistor 180 is provided which functions as a voltage comparator or level detector to bias the output power transistors 104 and 126 non-conductive in the event the voltage at the output terminal 4 exceeds the predetermined maximum output voltage. A reference voltage is applied to the base of the transistor 178 by the circuit including the transistors 170, 172 and 150 and the diode 160. This reference voltage is less than the voltage V+ by an amount equal to the sum of the emitter-base potentials of the transistors 170 and 172. The output terminal 6 is coupled to the emitter of the transistor 178 which functions to detect when the voltage at the output terminal 6 exceeds a magnitude equal to V+ minus one emitter-base voltage drop thereby representing a short of the output terminal 6 to the positive output terminal 14 of the DC supply 12. The collector of the transistor 178 is coupled to the base of a transistor 182, the base of a transistor 186 and to ground through a resistor 184. The emitters of each of the transistors 182 and 186 are coupled to ground, the collector of the transistor 182 is coupled to the base of the transistor 88, and the collector of the transistor 186 is coupled to the base of the transistor 64.

A reference voltage is applied to the base of the transistor 180 by the transistors 162, 164 and 152 and the diode 160. This reference potential is less than the voltage V+ by an amount equal to the sum of the emitter-base potentials of the transistors 162 and 164. The output terminal 4 is coupled to the emitter of the transistor 180 which functions to detect when the voltage at the output terminal 4 exceeds a magnitude equal to V+ minus one emitter-base voltage drop thereby representing a short of the output terminal 4 to the positive output terminal 14 of the DC supply 12. The collector of the transistor 180 is coupled to the base of the transistor 186, to the base of the transistor 182 and to ground through the resistor 184.

Each of the transistors 178 and 180 functions to compare the voltage at the respective output terminals 6 and 4 with a reference voltage equal to the voltage at the positive terminal 14 of the DC supply 12 minus the emitter-base drops of the respective transistor pairs 170–172 and 162–164. When the voltage at the output terminal 6 exceeds the reference voltage at the base of the transistor 178 by an amount equal to one emitter-base drop, the transistor 178 is biased conductive to develop a voltage across the resistor 184 which biases the transistors 182 and 186 conductive. The conduction of the transistor 182 grounds the base of the transistor 88 which is biased non-conductive to bias the transistor 90 non-conductive. The emitter-base current path for the transistor 118 is thereby removed which consequently is biased non-conductive to bias the output power transistor 126 non-conductive. The conduction of the transistor 186 grounds the base of the transistor 64 which is biased non-conductive to bias the transistor 66 non-conductive. The emitter-base current path for the transistor 98 is thereby removed which consequently is biased non-conductive to bias the output power transistor 104 non-conductive. In like manner, upon conduction of the transistor 180 when the voltage at the output terminal 4 exceeds the reference voltage at its base by an amount equal to one emitter-base drop, the transistors 182 and 186 are biased conductive by the resulting voltage across the resistor 184 to effect the biasing of the output power transistors 104 and 126 non-conductive in the same manner as previously described.

The biasing of the output transistor 126 non-conductive when a short of the output terminal 6 to the positive terminal 14 of the DC supply 12 is detected prevents over dissipation and resulting damage thereto. When the transistor 126 is biased non-conductive, the output power transistor 104 is also biased non-conductive to allow the voltage at the output terminal 4 to the voltage V + thereby reducing the current to the load 48 to zero upon the occurence of the short. In like manner, when the output terminal 4 is shorted to the positive terminal 4 of the DC supply 12, each of the transistors 104 and 126 are biased non-conductive in the same manner as previously described to prevent over dissipation therein and to reduce the current through the load 48 to zero.

OVER VOLTAGE PROTECTION

If the voltage V + were to increase to a value greater than a predetermined amount, over dissipation could occur in the output power transistors 102, 104, 124 and 126 resulting in damage thereto.

To prevent damage as a result of excessive voltage at the output terminal 14 of the DC supply 12, the output power transistors 102, 104, 124 and 126 are biased non-conductive when the voltage V + at the positive terminal 14 reaches the predetermined level above which over dissipation occurs. This predetermined level is detected by means of a voltage divider comprised of resistors 188 and 190 coupled between the supply voltage terminal 5 and ground and a Zener diode 192 coupled between the junction of the resistors 188 and 190 and the anode of a shutdown diode 194 whose cathode is coupled to ground. When the voltage V + exceeds the predetermined level, the Zener diode conducts to supply current through a shut-down diode 194 which is coupled between the base and emitters of NPN transistors 196, 198, 200 and 202. Conduction by the shutdown diode 194 biases each of the transistors 196, 198, 200 and 202 into a conductive state.

The collector of the transistor 196 is coupled to the base of the transistor 120 so that conduction of the transistor 196 is effective to bias the transistor 120 non-conductive to remove drive current from the base of the output power transistor 126 which is then biased non-conductive. The collector of the transistor 198 is coupled to the base of the transistor 122 so that conduction of the transistor 198 is effective to bias the transistor 122 non-conductive to remove base drive current to the output power transistor 124 which is biased non-conductive. The collector of the transistor 200 is coupled to the base of the transistor 100 so that conduction of the transistor 200 is effective to bias the transistor 100 non-conductive to remove base drive current from the transistor 102 which is biased non-conductive. The collector of the transistor 202 is coupled to the base of the transistor 99 so that conduction of the transistor 202 is effective to bias the transistor 99 non-conductive which is effective to remove the base drive current to the output power transistor 104 which is biased non-conductive.

When the voltage V + at the output terminal 14 of the DC supply 12 exceeds the predetermined value, the Zener diode 192 conducts to supply current to the shutdown diode 194. This current is mirrored in each of the transistors 196 through 202 which conduct to bias the output transistors 102, 104, 124 and 126 non-conductive to prevent over dissipation and damage thereto resulting from the excessive power supply voltage.

OVER CURRENT AND SHORT TO GROUND PROTECTION

An over current and short to ground protection circuit functions to protect the output power transistors 102, 104, 124 and 126 in the event that excessive current flows from the DC supply 12 to the output stages 97 and 119 of the bridge audio power amplifier 10 or a short to ground is detected at either of the output terminals 4 and 6 so as to prevent over dissipation in the power transistors and resultant damage thereto. The over current and short to ground protection circuit further cooperate to bias and maintain the output power transistors 102, 104, 124 and 126 non-conductive when there is an impedance between the output terminals 4 or 6 and the location of the short is ground fault such as may occur when a long conductor is used to couple the bridge audio power amplifier 10 to the load 48.

Current flow to the output stages 97 and 119 of the bridge audio power amplifier 10 is detected by the current sensing resistor 20 in FIG. 1 coupled between the voltage supply terminals 1 and 5 and therefore between the positive terminal 14 of the DC supply 12 and the output stage 97 and 119. The voltage developed across the current sensing resistor 20 is representative of the current flowing to the output stages 97 and 119. This voltage is detected by an overcurrent comparator 203 including PNP transistors 204, 206 and 208.

The emitter of the transistor 204 is coupled to the supply voltage terminal 1 through a resistor 209 and the emitter of the transistor 206 is coupled to the supply voltage terminal 9 through a resistor 210. The emitter of the transistor 208 is coupled to the base of each of the transistors 204 and 206 and the collector thereof is coupled to a grounded substrate. The base of the transistor 208 is coupled to the collector of the transistor 206. The collector of the transistor 204 is coupled to the base of an NPN transistor 212 and to the collector of an NPN transistor 214. The collector of the transistor 206 is coupled to the collector of an NPN transistor 216. The base of the transistor 214 is coupled to the anode of the diode 160 and the emitter thereof is coupled to ground through a resistor 218. The collector of the transistor 212 is coupled to the supply voltage terminal 1 through a resistor 220 and its emitter is coupled to the anode of the shut-down diode 194. The base of the transistor 216 is coupled to the anode of the diode 160 and the emitter thereof is coupled to ground through a resistor 222.

The transistor 214 has twice the emitter area of the transistor 216 and the resistor 222 has twice the resistance of the resistor 218. Consequently, the emitter current of the transistor 24 resulting from the base bias provided by the diode 160 is twice the emitter current of the transistor 216. During normal operation of the bridge audio power amplifier 10, the transistor 214, having twice the emitter area of the transistor 216, is saturated out so that no bias current is provided for the transistor 212 which is consequently non-conductive. When no current passes through the current sensing resistor 20 of FIG. 1, the emitter currents of the transistors 204 and 206 are equal as determined by the conduction of the transistor 216. Upon an increase in the current through the current sensing resistor 20, the potential at the voltage supply terminal 9 decreases as a function of the magnitude of the current. Decrease of the voltage at the voltage supply terminal 9 below the voltage at the voltage supply terminal 1 results in the decreased conduction in the transistor 206 which increases the base drive of the transistor 208 to increase the conduction of the transistor 204. The collector current of the transistor 214 increases in accordance with the conduction of the transistor 204 until the current through the current sensing resistor 20 increases to the maximum allowable current for the output stages 97 and 119 of the bridge audio power amplifier 10 at which time the transistor 214 goes out of saturation. Upon a further increase of the current through the current sensing resistor 20, the additional current through the transistor 204 biases the transistor 212 conductive which supplies current through the shut-down diode 194. Conduction by the shut-down diode 194 provides for the biasing of the output power transistors 102, 104, 124 and 126 non-conductive as previously described with respect to the over voltage protection circuit.

As can be seen, upon reduction of the current through the current sensing resistor 20 to a value below the maximum allowed current, the transistor 212 is again biased non-conductive to allow the output power transistors to again operate in normal manner.

To provide protection against a short to ground of either of the output terminals 4 and 6 and the resultant over dissipation in the output power transistors 102 and 124, a short to ground sensor 223 including NPN transistors 224 and 226 is provided having their collectors coupled to the collector of the transistor 206 in the over current comparator 203. The base of each of the transistors 224 and 226 is coupled to the base of the transistors 150 and 152. The emitter of the transistor 224 is coupled to the output terminal 4 through a diode 228 and the emitter of the transistor 226 is coupled to the output terminal 6 through a diode 230. The base of each of the transistors 224 and 226 is biased at a voltage equal to the sum of the base-emitter voltage drop of the transistors 150, 152 and the diode 160.

In operation, when the potential at either the output terminal 4 or output terminal 6 decreases to a voltage below the voltage drop across the diode 160, the respective transistor 224 or 226 is biased conductive to increase the base drive of the transistor 208. Increased conduction of the transistor 208 results in the biasing of the output power transistors 102, 104, 124 and 126 non-conductive as described with respect to the over current comparator 203.

When an impedance exists between the output terminal 4 or 6 and the short to ground as may occur in a long conductor between the output terminals 4 and 6 and the load 48, the short to ground detection circuit 223 would alone be inoperative to detect a ground in view of the voltage drop across the impedance. The over current comparator 203 detects the resultant increase of the current through the output stages 97 and 119 to bias the output power transistors 102, 104, 124 and 126 non-conductive as previously described. The potential at the output terminals 4 and 6 then decreases to ground potential which is detected by the short to ground detector 223 which maintains the output power transistors 102, 104, 124 and 126 biased non-conductive until the short to ground is removed. In this manner, the over current comparator 203 and the short to ground detector 223 function to protect the output power transistors in the event of a short to ground when an impedance exists between the short and the output terminal 4 or 6.

THERMAL PROTECTION

A thermal protection circuit is provided which controls the bias of the output power transistors 102, 104, 124 and 126 in response to sensed temperature to prevent permanent damage resulting from excessive temperatures.

The thermal protection circuit inlcudes an NPN transistor 232 having its emitter coupled to the anode of the shutdown diode 194 and its collector connected to the voltage supply terminal 1 through a resistor 234. A base bias is provided for the transistor 232 by an NPN transistor 236 having its base coupled to the cathode of the Zener diode 146, its collector connected to the voltage supply terminal 1 and its emitter coupled to ground through a voltage divider comprised of a resistor 238 and a resistor 240.

The transistor 236 and the resistors 238 and 240 in conjunction with the Zener diode 146 provide a base bias for the transistor 232 which is less than the sum of the base-emitter voltage of the transistor 232 and the voltage of the shut-down diode 194 for all temperatures below the critical temperature at which thermal protection is to be initiated. At temperatures above the critical temperature, the sum of the temperature responsive base-emitter voltage of the transistor 232 and the temperature responsive voltage of the shut-down diode 194 decreases to below the base bias supplied to the transistor 232 which then conducts to supply current through the shut-down diode 194. This current has a magnitude increasing with increasing temperatures above the critical temperature and controls the conduction of the transistors 196, 198, 200 and 202 which in turn decrease the bias of the output power transistors 102, 104, 124 and 126. The bias of the power transistors 102, 104, 124 and 126 are decreased as a function of temperature until a steady state dissipation is reached which is below a level which may result in permanent damage. If, for some reason such as heat from an external heat source, the sensed temperature were to continue to rise, a temperature may be reached where the output power transistors 102, 104, 124 and 126 are biased into non-conduction.

What has been described is a protection circuit for a power amplifier for protecting the output power transistors against damage as a result of all failure modes which may occur durring assembly or operation which may result in permanent damage.

The above description of a preferred embodiment for the purpose of explaining the principles of the invention is not to be considered as limiting or restricting the invention since many modifications can be made by the exercise of skill in the art without departing from the scope of the invention.

What is claimed is:

1. A protection circuit for a power amplifier having an output stage including a pair of transistors serially connected between respective positive and negative supply terminals of a direct current supply and providing an output terminal intermediate the transistors for connection to a load, the protection circuit comprising:
   generating means effective to supply a constant value reference voltage;
   a voltage comparator coupled with the generating means and the output terminal of the power amplifier effective to supply a control signal when the voltage at the output terminal of the power amplifier attains a predetermined relationship relative to the constant value reference voltage, the predetermined relationship representing a short of the output terminal of the power amplifier to the positive supply terminal of the direct current supply; and
   circuit means coupled to the voltage comparator and the transistor in the output stage that is connected to the negative supply terminal of the direct current supply effective to bias the last mentioned transistor non-conductive in response to a control signal supplied by the voltage comparator, the current through the transistor coupled to the negative supply terminal being limited by the circuit means in response to a detected short of the output terminal to the positive terminal of the direct current supply so as to protect the power amplifier from damage to excess current resulting from said short.

2. A protection circuit for a bridge power amplifier having an output stage including first and second pairs of transistors, the transistors in each pair being serially connected between respective positive and negative supply terminals of a direct current supply and providing a respective output terminal intermediate the transistors for connection to respective sides of a load, the protection circuit comprising:
   a first voltage detector coupled to the output terminal provided by the first pair of transistors effective to supply a control signal when the voltage at the output terminal coupled therewith is greater than a predetermined level representing a short to the positive terminal of the direct current supply;
   a second voltage detector coupled to the output terminal provided by the second pair of transistors effective to supply a control signal when the voltage at the output terminal coupled therewith is greater than the predetermined level representing a short to the positive terminal of the direct current supply;
   first circuit means coupled to the first and second voltage detectors and the one transistor in the first pair of transistors that is coupled to the negative supply terminal effective to bias the last mentioned transistor non-conductive in response to a control signal generated by the first or second voltage detector; and
   second circuit means coupled to the first and second voltage detectors and the one transistor in the second pair of transistors that is coupled to the negative supply terminal effective to bias the last mentioned transistor non-conductive in response to a control signal generated by the first or second voltage detector, whereby excessive dissipation is prevented in the transistors coupled to the negative supply terminal and the potential at the one supply terminal is increased to the voltage at the positive supply terminal in response to a short of the other one of the output terminals to the positive supply terminal.

3. A protection circuit for a power amplifier having an output stage including a pair of transistors serially connected between respective positive and negative potential output terminals of a direct current supply and providing an output terminal intermediate the transistors for connection to a load, the protection circuit comprising:
   a current sensor effective to monitor the current supplied by the direct current supply to the output stage;
   means coupled to the current sensor effective to provide a control signal when the current monitored by the current sensor exceeds a specified maximum value;
   a negative potential sensor coupled to the output terminal effective to provide a control signal when the output terminal is at the potential of the negative potential output terminal; and
   means effective to bias the transistors non-conductive in response to a control signal generated by the current sensor or the negative potential sensor, whereby the transistors are biased non-conductive to prevent over dissipation therein in response to excessive current therethrough when the output terminal is shorted to the potential of the negative potential output terminal through an impedance and the negative potential sensor maintains the transistors bias non-conductive in response to the sensed potential of the negative potential output terminal after the transistors are initially biased non-conductive.

4. A short circuit protection circuit for a bridge power amplifier having an output stage including first and second pairs of transistors, the transistors in each pair being serially connected between respective positive and negative potential output terminals of a direct current supply and providing a respective output terminal intermediate the transistors for connection to respective sides of a load, the protection circuit comprising:
   a first voltage detector coupled to the output terminal provided by the first pair of transistors effective to supply a first control signal when the voltage at the output terminal coupled therewith is greater than a predetermined level representing a short to the positive terminal of the direct current supply ;
   a second voltage detector coupled to the output terminal provided by the second pair of transistors effective to supply a second control signal when the voltage at the output terminal coupled therewith is greater than the predetermined level representing a short to the positive terminal of the direct current supply;

first circuit means coupled to the first and second voltage detectors and the one transistor in the first pair of transistors that is coupled to the negative potential output terminal effective to bias the last mentioned transistor non-conductive in response to a first or second control signal generated by the first or second voltage detector;

second circuit means coupled to the first and second voltage detectors and the one transistor in the second pair of transistors that is coupled to the negative potential output terminal effective to bias the last mentioned transistor non-conductive in response to a first or second control signal generated by the first or second voltage detector;

a current sensor effective to monitor the current supplied by the direct current supply to the output stage;

means coupled to the current sensor effective to provide a third control signal when the current monitored by the current sensor exceeds a specified maximum value;

a negative potential sensor coupled to the output terminals provided by the first and second pairs of transistors effective to provide a fourth control signal when one of the output terminals is at the potential of the negative potential output terminal; and means effective to bias the transistors in each of the first and second pairs of transistors non-conductive in response to a third or fourth control signal generated by the current sensor or the negative potential sensor, whereby the bridge power amplifier is protected against damage resulting from a short circuit to either terminal of the direct current supply.

* * * * *